United States Patent
Zhang (10) Patent No.: US 10,504,731 B2
(45) Date of Patent: Dec. 10, 2019

(54) TFT SUBSTRATE AND MANUFACTURING METHOD THEREOF

(71) Applicant: Wuhan China Star Optoelectronics Technology Co., Ltd., Wuhan (CN)

(72) Inventor: Pengzhen Zhang, Wuhan (CN)

(73) Assignee: WUHAN CHINA STAR OPTOELECTRONICS TECHNOLOGY CO., LTD., Wuhan, Hubei (CN)

( * ) Notice: Subject to any disclaimer, the term of this patent is extended or adjusted under 35 U.S.C. 154(b) by 457 days.

(21) Appl. No.: 15/329,234

(22) PCT Filed: Dec. 27, 2016

(86) PCT No.: PCT/CN2016/112253
§ 371 (c)(1),
(2) Date: Jan. 25, 2017

(87) PCT Pub. No.: WO2018/086210
PCT Pub. Date: May 17, 2018

(65) Prior Publication Data
US 2018/0337049 A1     Nov. 22, 2018

(30) Foreign Application Priority Data

Nov. 8, 2016   (CN) .......................... 2016 1 0983782

(51) Int. Cl.
*H01L 21/203*     (2006.01)
(52) U.S. Cl.
CPC .................. *H01L 21/203* (2013.01)
(58) Field of Classification Search
None
See application file for complete search history.

(56) References Cited

U.S. PATENT DOCUMENTS

| | | | |
|---|---|---|---|
| 10,224,515 B2* | 3/2019 | Lim | H01L 51/5253 |
| 2014/0043683 A1* | 2/2014 | Jo | G02B 5/3033 |
| | | | 359/483.01 |
| 2016/0365392 A1* | 12/2016 | Li | H01L 51/56 |

FOREIGN PATENT DOCUMENTS

| CN | 101765628 A | 6/2010 |
|---|---|---|
| CN | 104600081 A | 5/2015 |

* cited by examiner

*Primary Examiner* — Robert K Carpenter
(74) *Attorney, Agent, or Firm* — Leong C. Lei (57) ABSTRACT

The present invention provides a TFT substrate and a manufacturing method thereof. The manufacturing method of the TFT substrate according to the present invention includes additionally providing a transparent polypropylene film on an IGZO active layer to provide an effect of blocking UV light and thus preventing UV light from affecting stability of the IGZO active layer so as to improve stability of a TFT device without increasing the number of masks used. When the manufacturing method of the TFT substrate according to the present invention is applied to production of OLED display panels, the transparent polypropylene film may serve as a planarization layer so that the existing manufacturing process of OLED display panels does not need to be modified and manufacturing costs are not increased. Further, the TFT substrate so manufactured adopts a back channel etching type IGZO-TFT structure, which, as compared to a traditional etch stop type IGZO-TFT structure, requires fewer photoengraving operations and a lower manufacturing cost. The TFT substrate according to the present invention includes a transparent polypropylene film additionally provided on an IGZO active layer to provide an effect of blocking UV light so as to improve stability of a TFT device and manufacturing cost is low.

13 Claims, 5 Drawing Sheets

TFT SUBSTRATE AND MANUFACTURING METHOD THEREOF

BACKGROUND OF THE INVENTION

1. Field of the Invention

The present invention relates to the field of display technology, and more particular to a thin-film transistor (TFT) substrate and a manufacturing method thereof.

2. The Related Arts

With the progress of the display technology, flat panel display devices, such as liquid crystal displays (LCDs), due to various advantages, such as high image quality, low power consumption, thin device body, and wide range of applications, have been widely used in all sorts of consumer electronic products, including mobile phones, televisions, personal digital assistants (PDAs), digital cameras, notebook computers, and desktop computers, making them the main stream of display devices.

Most of the liquid crystal display devices that are currently available in the market are backlighting LCDs, which comprise a liquid crystal display panel and a backlight module. The working principle of the liquid crystal display panel is that with liquid crystal molecules disposed between two parallel glass substrates and multiple vertical and horizontal tiny conductive wires arranged between the two glass substrates, electricity is applied to control direction change of the liquid crystal molecules for refracting out light emitting from the backlight module to generate an image.

The liquid crystal display panel is made up of a color filter (CF) substrate, a thin-film transistor (TFT) substrate, liquid crystal (LC) interposed between the CF substrate and the TFT substrate, and sealant and is generally manufactured with a process involving an anterior stage of array engineering (for thin film, photolithography, etching, and film peeling), an intermediate stage of cell engineering (for lamination of the TFT substrate and the CF substrate), and a posterior stage of module assembly (for combining a drive integrated circuit (IC) and a printed circuit board). Among these stages, the anterior stage of array engineering generally involves the formation the TFT substrate for controlling the movement of liquid crystal molecules; the intermediate stage of cell engineering generally involves filling liquid crystal between the TFT substrate and the CF substrate; and the posterior stage of module assembly generally involves the combination of the drive IC and the printed circuit board for driving the liquid crystal molecules to rotate for displaying images.

Organic light-emitting diode (OLED) displays, which also referred to organic electroluminescent displays, are a newly emerging flat panel display device and demonstrates prosperous future applications due to advantages including easy manufacturing operation, low cost, low power consumption, high luminous brightness, wide range of adaptation of working temperature, compact size, fast response, each realization of color displaying and large-screen displaying, easy realization of combination with integrated circuit drives, and easy realization of flexible displaying.

An OLED is generally made up of a substrate, an anode arranged on the substrate, a hole injection layer arranged on and anode, a hole transport layer arranged on the hole injection layer, an emissive layer arranged on the hole transport layer, an electron transport layer arranged on the emissive layer, an electron injection layer arranged on the electron transport layer, and a cathode arranged on the electron injection layer. The principle of light emission of an OLED display device is that when a semiconductor material and an organic light emission material are driven by an electric field, carrier currents are injected and re-combine to cause emission of light. Specifically, the OLED display device often uses an indium tin oxide (ITO) pixel electrode and a metal electrode to respectively serve as the anode and cathode of the device and electrons and holes, when driven by a predetermined electrical voltage, are respectively injected into the electron transport layer and the hole transport layer such that the electrons and the holes respectively migrate through the electron transport layer and the hole transport layer to get into the emissive layer and meet in the emissive layer to form excitons that excites light emissive molecules to emit light, the later undergoing radiation relaxation to give off visible light.

Based on the way of driving, OLEDs can be classified in two categories, passive matrix OLED (PMOLED) and active matrix OLED (AMOLED), namely one for direct addressing, and the other for TFT array addressing, among which, the AMOLED comprises pixels that are arranged in an array and belongs to an active display type, having high light emission performance and being commonly used in high definition large-sized display devices.

TFTs are the primary drive elements that are currently used in liquid crystal display devices and active matrix organic light-emitting diode display devices and are directly related to the trend of development of high performance flat panel display devices. Indium gallium zinc oxide (IGZO) has various advantages, including high mobility, applicability to manufacturing in large areas, and easy adaption of amorphous silicon (a-Si) manufacturing processes and is current a hot spot of researches conducted in the field of thin-film transistor technology. However, an IGZO active layer of an IGZO TFT is very sensitive to manufacturing operation and environment and it is often necessary to use an etch stop (ES) layer and involve an additional mask to protect the IGZO active layer, this being adverse to cost reduction of a TFT manufacturing process. Further, due to stacking between source/drain (S/D) terminals and the etch stop (ES) layer, the size of a channel of the TFT device must be made relatively large and parasitic capacitance is also increased. Further, due to the forbidden bandwidth of IGZO (which is around 3.4 eV) being close to the forbidden bandwidth of ultraviolet (UV) light, IGZO shows excellent absorption of UV light and an IGZO active layer, when irradiated with UV light, would cause valence-band electrons to readily jump to conduction band through absorption of energy, resulting in threshold voltage shifting of a TFT and making the display performance of a display unstable.

SUMMARY OF THE INVENTION

An objective of the present invention is to provide a manufacturing method of a thin-film transistor (TFT) substrate, which helps improve stability of a TFT device and makes manufacturing cost low.

Another objective of the present invention is to provide a TFT substrate, which helps improve stability of a TFT device and makes manufacturing cost low.

To achieve the above objectives, the present invention provides a manufacturing method of a TFT substrate, which comprises the following steps:

Step 1: providing a backing plate, forming a gate electrode on the backing plate, and forming a gate insulation layer on the gate electrode and the backing plate;

Step 2: forming an active layer on the gate insulation layer to be located above and corresponding to the gate electrode and forming a source electrode and a drain electrode on the active layer and the gate insulation layer such that the source electrode and the drain electrode are respectively in contact with two opposite ends of the active layer; and Step 3: forming a passivation layer on the source electrode, the drain electrode, the active layer, and the gate insulation layer and forming a transparent polypropylene film on the passivation layer.

The transparent polypropylene film formed in Step 3 has a surface that is planar and flat to constitute a planarization layer, and the manufacturing method of the TFT substrate further comprises:

Step 4: forming a first via in the planarization layer and the passivation layer to be located above and corresponding to the drain electrode and forming a first electrode on the planarization layer, such that the first electrode is set in connection with the drain electrode through the first via; and forming a pixel definition layer on the first electrode and the planarization layer and forming a second via in the pixel definition layer to be located above and corresponding to the first electrode.

The active layer comprises a material of indium gallium zinc oxide.

The backing plate comprises a glass substrate; the gate electrode, the source electrode, and the drain electrode each comprise a material comprising one or multiple ones of molybdenum, aluminum, copper, titanium, and chromium; the gate insulation layer and the passivation layer each comprise a material comprising one or multiple ones of silicon oxide and silicon nitride.

In addition, Step 4 further comprises: forming an OLED emissive layer and a second electrode in the second via in sequence from bottom to top; the first electrode and the second electrode are respectively an anode and a cathode; and the first electrode and the second electrode each comprise a material comprising one or multiple ones of a metal and a transparent conductive metal oxide.

The present invention also provides a TFT substrate, which comprises: a backing plate, a gate electrode arranged on the backing plate, a gate insulation layer arranged on the gate electrode and the backing plate, an active layer arranged on the gate insulation layer and located above and corresponding to the gate electrode, a source electrode and a drain electrode arranged on the active layer and the gate insulation layer and respectively in contact with two opposite ends of the active layer, a passivation layer arranged on the source electrode, the drain electrode, the active layer, and the gate insulation layer, and a transparent polypropylene film arranged on the passivation layer.

The transparent polypropylene film has a surface that is planar and flat and constitutes a planarization layer, the TFT substrate further comprising: a first via formed in the planarization layer and the passivation layer and located above and corresponding to the drain electrode, a first electrode arranged on the planarization layer, a pixel definition layer arranged on the first electrode and the planarization layer, and a second via formed in the pixel definition layer and located above and corresponding to the first electrode such that the first electrode is set in connection with the drain electrode through the first via.

The active layer comprises a material of indium gallium zinc oxide.

The backing plate comprises a glass substrate; the gate electrode, the source electrode, and the drain electrode each comprise a material comprising one or multiple ones of molybdenum, aluminum, copper, titanium, and chromium; the gate insulation layer and the passivation layer each comprise a material comprising one or multiple ones of silicon oxide and silicon nitride.

In addition, the TFT substrate further comprises: an organic light-emitting diode (OLED) emissive layer and a second electrode formed in the second via in sequence from bottom to top, the first electrode and the second electrode being respectively an anode and a cathode, the first electrode and the second electrode each comprising a material comprising one or multiple ones of a metal and a transparent conductive metal oxide.

The present invention further provides a TFT substrate, which comprises: a backing plate, a gate electrode arranged on the backing plate, a gate insulation layer arranged on the gate electrode and the backing plate, an active layer arranged on the gate insulation layer and located above and corresponding to the gate electrode, a source electrode and a drain electrode arranged on the active layer and the gate insulation layer and respectively in contact with two opposite ends of the active layer, a passivation layer arranged on the source electrode, the drain electrode, the active layer, and the gate insulation layer, and a transparent polypropylene film arranged on the passivation layer;

wherein the active layer comprises a material of indium gallium zinc oxide; and wherein the backing plate comprises a glass substrate; the gate electrode, the source electrode, and the drain electrode each comprise a material comprising one or multiple ones of molybdenum, aluminum, copper, titanium, and chromium; the gate insulation layer and the passivation layer each comprise a material comprising one or multiple ones of silicon oxide and silicon nitride.

The efficacy of the present invention is that the present invention provides a TFT substrate and a manufacturing method thereof. The manufacturing method of the TFT substrate according to the present invention comprises additionally providing a transparent polypropylene film on an IGZO active layer to provide an effect of blocking UV light and thus preventing UV light from affecting stability of the IGZO active layer so as to improve stability of a TFT device without increasing the number of masks used. When the manufacturing method of the TFT substrate according to the present invention is applied to production of OLED display panels, the transparent polypropylene film may serve as a planarization layer so that the existing manufacturing process of OLED display panels does not need to be modified and manufacturing costs are not increased. Further, the TFT substrate so manufactured adopts a back channel etching type IGZO-TFT structure, which, as compared to a traditional etch stop type IGZO-TFT structure, requires fewer photoengraving operations and a lower manufacturing cost. The TFT substrate according to the present invention comprises a transparent polypropylene film additionally provided on an IGZO active layer to provide an effect of blocking UV light so as to improve stability of a TFT device and manufacturing cost is low.

For better understanding of the features and technical contents of the present invention, reference will be made to the following detailed description of the present invention and the attached drawings. However, the drawings are provided only for reference and illustration and are not intended to limit the present invention.

BRIEF DESCRIPTION OF THE DRAWINGS

The technical solution, as well as other beneficial advantages, of the present invention will become apparent from the following detailed description of embodiments of the present invention, with reference to the attached drawings.

In the drawings.

DETAILED DESCRIPTION OF THE PREFERRED EMBODIMENTS

To further expound the technical solution adopted in the present invention and the advantages thereof, a detailed description will be given with reference to the preferred embodiments of the present invention and the drawings thereof.

Figure 1:
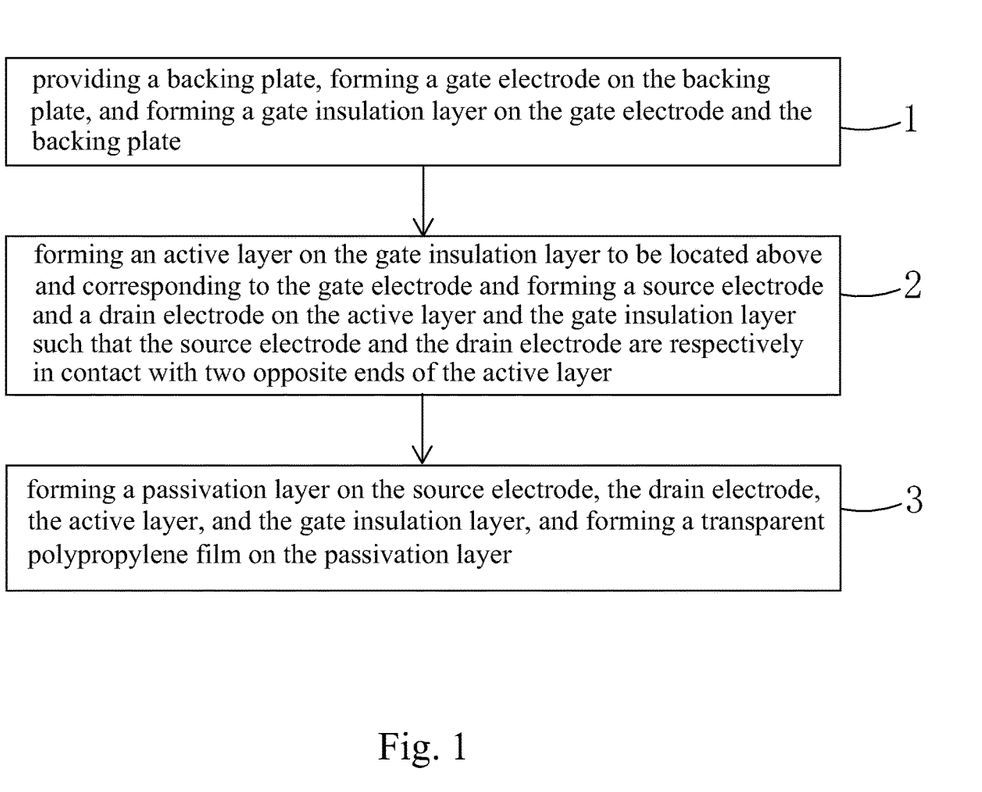
FIG. 1 is a flow chart illustrating a manufacturing method of a thin-film transistor (TFT) substrate according to the present invention.
Figure 2:
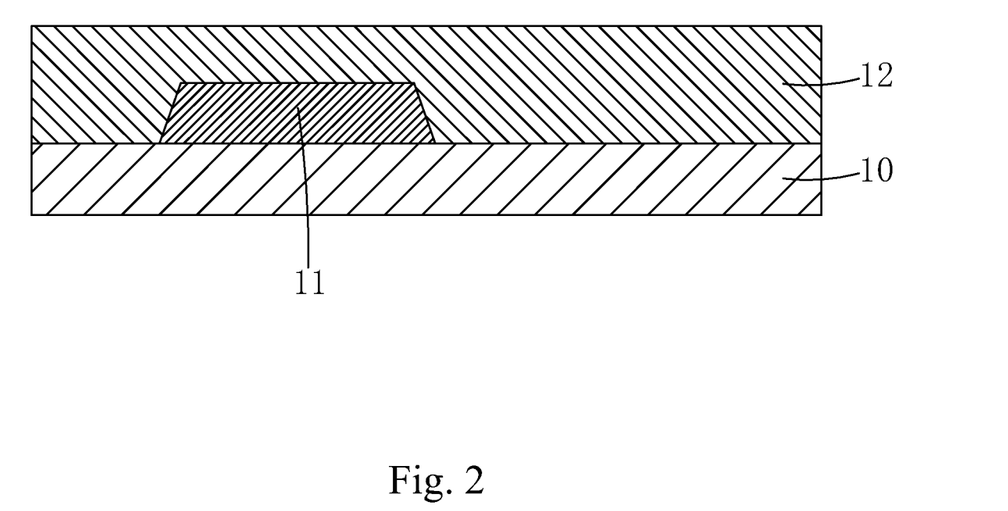
FIG. 2 is a schematic view illustrating Step 1 of the manufacturing method of the TFT substrate according to the present invention.

Referring to FIG. 1, the present invention first provides a manufacturing method of a thin-film transistor (TFT) substrate, which comprises the following steps:

Step 1: as shown in FIG. 2, providing a backing plate 10, forming a gate electrode 11 on the backing plate 10, and forming a gate insulation layer 12 on the gate electrode 11 and the backing plate 10.

Specifically, the backing plate 10 comprises a glass substrate.

Specifically, the gate electrode 11 comprises a material comprising one or multiple ones of molybdenum (Mo), aluminum (Al), copper (Cu), titanium (Ti), and chromium (Cr).

Specifically, the gate insulation layer 12 comprises a material comprising one or multiple ones of silicon oxide ($SiO_x$) and silicon nitride ($SiN_x$). Preferably, the gate insulation layer 12 comprises a material of silicon oxide.

Specifically, in Step 1, physical vapor deposition (PVD) is applied to deposit a metal film and a photoengraving process is applied to subject the metal film to patterning treatment so as to form the gate electrode 11.

Specifically, in Step 1, chemical vapor deposition (CVD) is applied to deposit and form the gate insulation layer 12.

Figure 3:
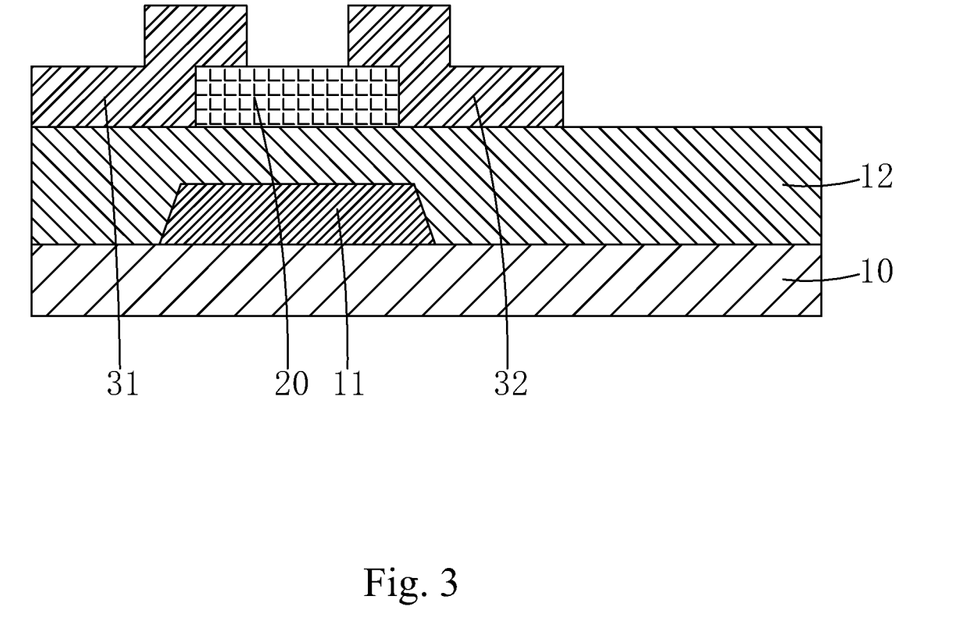
FIG. 3 is a schematic view illustrating Step 2 of the manufacturing method of the TFT substrate according to the present invention.

Step 2: as shown in FIG. 3, forming an active layer 20 on the gate insulation layer 12 to be located above and corresponding to the gate electrode 11 and forming a source electrode 31 and a drain electrode 32 on the active layer 20 and the gate insulation layer 12 such that the source electrode 31 and the drain electrode 32 are respectively in contact with two opposite ends of the active layer 20.

Specifically, the active layer 20 comprises a material of indium gallium zinc oxide (IGZO).

Specifically, the source electrode 31 and the drain electrode 32 each comprise a material comprising one or multiple ones of molybdenum (Mo), aluminum (Al), copper (Cu), titanium (Ti), and chromium (Cr).

Specifically, in Step 2, chemical vapor deposition (CVD) is applied to deposit and form a semiconductor layer, applying a photoengraving process to subject the semiconductor layer to patterning treatment so as to form the active layer 20, wherein the photoengraving process comprises operations of coating photoresist, exposure, development, and dry etching.

Specifically, in Step 2, physical vapor deposition (PVD) is applied to deposit a metal film, and a photoengraving process is applied to subject the metal film to patterning treatment so as to form the source electrode 31 and the drain electrode 32.

Figure 4:
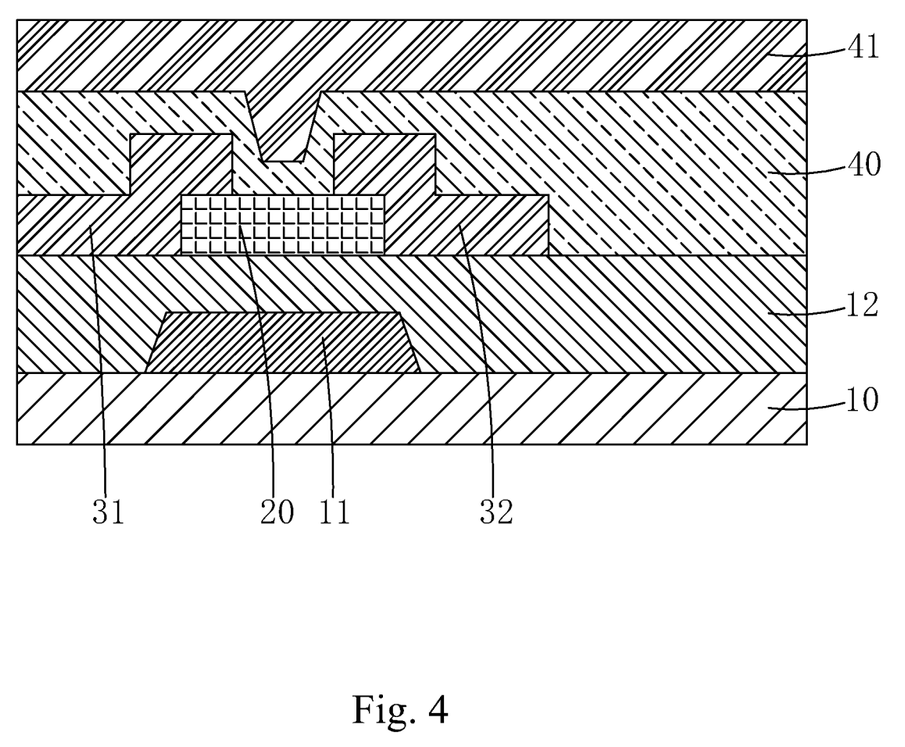
FIG. 4 is a schematic view illustrating Step 3 of the manufacturing method of the TFT substrate according to the present invention and is also a schematic view illustrating the structure of the TFT substrate according to the present invention.

Step 3: as shown in FIG. 4, forming a passivation layer 40 on the source electrode 31, the drain electrode 32, the active layer 20, and the gate insulation layer 12 and forming a transparent polypropylene film 41 on the passivation layer 40.

Specifically, the passivation layer 40 comprises a material comprising one or multiple ones of silicon oxide ($SiO_x$) and silicon nitride ($SiN_x$). Preferably, the passivation layer 40 comprises a material of silicon oxide.

Specifically, in Step 3, chemical vapor deposition (CVD) is applied to deposit and form the passivation layer 40.

Specifically, in Step 3, a coating operation is applied to form the transparent polypropylene film 41.

The transparent polypropylene film 41 has excellent visible light transmission property and good ultraviolet (UV) light blocking property and may effectively prevent an IGZO-TFT from causing shifting of threshold voltage due to influence of UV light and the surrounding environment so as to improve stability of a TFT device. Further, the formation of the transparent polypropylene film 41 requires no use of masks and no addition of photoengraving operations so that manufacturing cost can be effectively saved.

Figure 5:
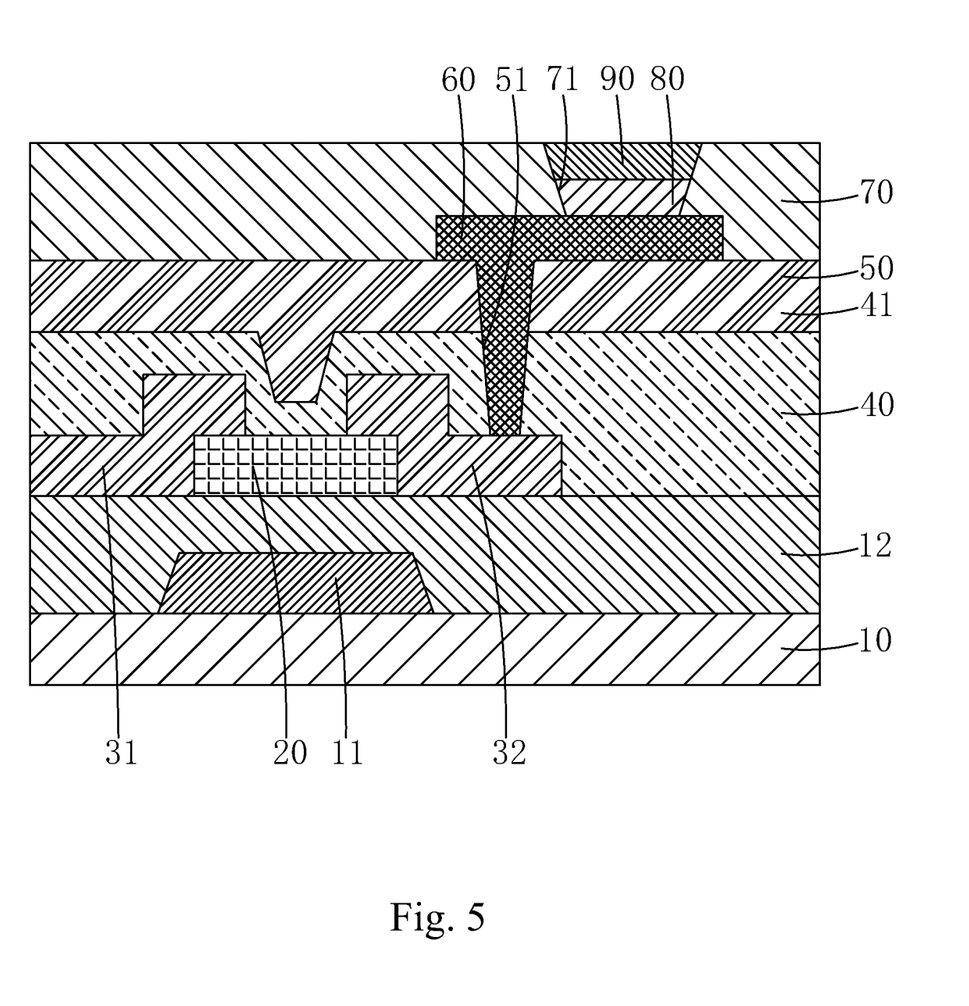
FIG. 5 is a schematic view illustrating Step 4 of the manufacturing method of the TFT substrate according to the present invention and is also a schematic view illustrating the structure of a preferred embodiment of the TFT substrate according to the present invention.

Specifically, the manufacturing method of the TFT substrate according to the present invention is applicable to the production of a TFT substrate for liquid crystal display panels and is also applicable to the production of a TFT substrate for AMOLED display panels. When the manufacturing method of the TFT substrate according to the present invention is used to manufacture a TFT substrate for AMOLED display panels, the transparent polypropylene film 41 formed in Step 3 has a surface that is planar and flat and may constitute a planarization layer 50. Further, the manufacturing method of the TFT substrate may further comprise:

Step 4: as shown in FIG. 5, forming a first via 51 in the planarization layer 50 and the passivation layer 40 to be located above and corresponding to the drain electrode 32 and forming a first electrode 60 on the planarization layer 50, such that the first electrode 60 is set in connection with the drain electrode 32 through the first via 51; and forming a pixel definition layer 70 on the first electrode 60 and the planarization layer 50 and forming a second via 71 in the pixel definition layer 70 to be located above and corresponding to the first electrode 60. To this point, a TFT substrate useful for AMOLED display panels is formed.

Further, Step 4 may additionally comprise: forming an OLED emissive layer 80 and a second electrode 90 in the second via 71 in sequence from bottom to top.

Specifically, the first electrode 60 and the second electrode 90 are respectively a cathode and an anode, or alternatively, an anode and a cathode, respectively.

Specifically, the first electrode 60 and the second electrode 90 each comprise a material comprising one or multiple ones of a metal and a transparent conductive metal oxide.

Specifically, the pixel definition layer 70 comprises a material of organic photoresist material.

Specifically, in Step 4, the first via 51 is formed through operations of exposure, development, and dry etching.

Specifically, in Step 4, physical vapor deposition (PVD) is applied to deposit a conductive film, and a photoengraving operation is applied to subject the conductive film to patterning treatment to form the first electrode 60.

Specifically, in Step 4, a coating operation is applied to form the pixel definition layer 70 and operations of exposure and development are applied to form the second via 71 in the pixel definition layer 70.

Specifically, in Step 4, evaporation is applied to form the OLED emissive layer 80.

Specifically, in Step 4, physical vapor deposition (PVD) is applied to deposit a conductive film, and a photoengraving operation is applied to subject the conductive film to patterning treatment to form the second electrode 90.

The above-described manufacturing method of the TFT substrate comprises additionally providing a transparent polypropylene film on an IGZO active layer to provide an effect of blocking UV light and thus preventing UV light from affecting stability of the IGZO active layer so as to improve stability of a TFT device without increasing the number of masks used. When the manufacturing method of the TFT substrate according to the present invention is applied to production of OLED display panels, the transparent polypropylene film may serve as a planarization layer so that the existing manufacturing process of OLED display panels does not need to be modified and manufacturing costs are not increased. Further, the TFT substrate so manufactured adopts a back channel etching (BCE) type IGZO-TFT structure, which, as compared to a traditional etch stop (ES) type IGZO-TFT structure, requires fewer photoengraving operations and a lower manufacturing cost.

Referring to FIG. 4, based on the above-described manufacturing method of the TFT substrate, the present invention also provides a TFT substrate, which comprises: a backing plate 10, a gate electrode 11 arranged on the backing plate 10, a gate insulation layer 12 arranged on the gate electrode 11 and the backing plate 10, an active layer 20 arranged on the gate insulation layer 12 and located above and corresponding to the gate electrode 11, a source electrode 31 and a drain electrode 32 arranged on the active layer 20 and the gate insulation layer 12 and respectively in contact with two opposite ends of the active layer 20, a passivation layer 40 arranged on the source electrode 31, the drain electrode 32, the active layer 20, and the gate insulation layer 12, and a transparent polypropylene film 41 arranged on the passivation layer 40.

Specifically, the active layer 20 comprises a material of indium gallium zinc oxide (IGZO).

The transparent polypropylene film 41 has excellent visible light transmission property and good ultraviolet (UV) light blocking property and may effectively prevent an IGZO-TFT from causing shifting of threshold voltage due to influence of UV light and the surrounding environment so as to improve stability of a TFT device.

Specifically, the TFT substrate according to the present invention is applicable to liquid crystal display panels or AMOLED display panels. Referring to FIG. 5, when the TFT substrate according to the present invention is applied to the AMOLED display panels, the transparent polypropylene film 41 has a surface that is planar and flat and may constitute a planarization layer 50. The TFT substrate may further comprise: a first via 51 formed in the planarization layer 50 and the passivation layer 40 and located above and corresponding to the drain electrode 32, a first electrode 60 arranged on the planarization layer 50, a pixel definition layer 70 arranged on the first electrode 60 and the planarization layer 50, and a second via 71 formed in the pixel definition layer 70 and located above and corresponding to the first electrode 60 such that the first electrode 60 is set in connection with the drain electrode 32 through the first via 51.

Further, the TFT substrate may additionally comprise: an OLED emissive layer 80 and a second electrode 90 formed in the second via 71 in sequence from bottom to top.

Specifically, t the first electrode 60 and the second electrode 90 are respectively a cathode and an anode, or alternatively, an anode and a cathode, respectively. The first electrode 60 and the second electrode 90 each comprise a material comprising one or multiple ones of a metal and a transparent conductive metal oxide.

Specifically, the pixel definition layer 70 comprises a material of organic photoresist material.

Specifically, the backing plate 10 comprises a glass substrate.

Specifically, the gate electrode 11, the source electrode 31, and the drain electrode 32 each comprise a material comprising one or multiple ones of molybdenum (Mo), aluminum (Al), copper (Cu), titanium (Ti), and chromium (Cr).

Specifically, the gate insulation layer 12 and the passivation layer 40 each comprise a material comprising one or multiple ones of silicon oxide ($SiO_x$) and silicon nitride ($SiN_x$). Preferably, the gate insulation layer 12 and the passivation layer 40 each comprise a material of silicon oxide.

The above-described TFT substrate comprises a transparent polypropylene film additionally provided on an IGZO active layer to provide an effect of blocking UV light and thus preventing UV light from affecting stability of the IGZO active layer so as to improve stability of a TFT device without increasing the number of masks used. When the TFT substrate according to the present invention is applied to OLED display panels, the transparent polypropylene film may serve as a planarization layer so that the existing manufacturing process of OLED display panels does not need to be modified and manufacturing costs are not increased. Further, the TFT substrate so manufactured adopts a back channel etching (BCE) type IGZO-TFT structure, which, as compared to a traditional etch stop (ES) type IGZO-TFT structure, requires fewer photoengraving operations and a lower manufacturing cost.

In summary, the present invention provides a TFT substrate and a manufacturing method thereof. The manufacturing method of the TFT substrate according to the present invention comprises additionally providing a transparent polypropylene film on an IGZO active layer to provide an effect of blocking UV light and thus preventing UV light from affecting stability of the IGZO active layer so as to improve stability of a TFT device without increasing the number of masks used. When the manufacturing method of the TFT substrate according to the present invention is applied to production of OLED display panels, the transparent polypropylene film may serve as a planarization layer so that the existing manufacturing process of OLED display panels does not need to be modified and manufacturing costs are not increased. Further, the TFT substrate so manufactured adopts a back channel etching type IGZO-TFT structure, which, as compared to a traditional etch stop type IGZO-TFT structure, requires fewer photoengraving operations and a lower manufacturing cost. The TFT substrate according to the present invention comprises a transparent polypropylene film additionally provided on an IGZO active layer to provide an effect of blocking UV light so as to improve stability of a TFT device and manufacturing cost is low.

Based on the description given above, those having ordinary skills in the art may easily contemplate various changes and modifications of the technical solution and the technical ideas of the present invention. All these changes and modifications are considered belonging to the protection scope of the present invention as defined in the appended claims.

What is claimed is:

1. A manufacturing method of a thin-film transistor (TFT) substrate, comprising the following steps:
    Step 1: providing a backing plate, forming a gate electrode on the backing plate, and forming a gate insulation layer on the gate electrode and the backing plate;
    Step 2: forming an active layer on the gate insulation layer to be located above and corresponding to the gate electrode and forming a source electrode and a drain electrode on the active layer and the gate insulation layer such that the source electrode and the drain electrode are respectively in contact with two opposite ends of the active layer; and
    Step 3: forming a passivation layer on the source electrode, the drain electrode, the active layer, and the gate insulation layer, and forming a transparent polypropylene film on the passivation layer,
    wherein the passivation layer is directly deposited on and in contact with tops of the source electrode, the drain electrode, and the active layer, and the transparent polypropylene film is directly coated on a top surface of the passivation layer such that a bottom surface of the transparent polypropylene film is in direct contact with the top surface of the passivation layer and an opposite, top surface of the transparently polypropylene film forms a flat planar surface that is opposite to the active layer.

2. The manufacturing method of the TFT substrate as claimed in claim 1, wherein the top surface of the transparent polypropylene film formed in Step 3 that forms the flat planar surface constitutes a planarization layer, and the manufacturing method of the TFT substrate further comprises:
    Step 4: forming a first via in the planarization layer and the passivation layer to be located above and corresponding to the drain electrode and forming a first electrode on the planarization layer, such that the first electrode is set in connection with the drain electrode through the first via; and
    forming a pixel definition layer on the first electrode and the planarization layer, and forming a second via in the pixel definition layer to be located above and corresponding to the first electrode.

3. The manufacturing method of the TFT substrate as claimed in claim 1, wherein the active layer comprises a material of indium gallium zinc oxide.

4. The manufacturing method of the TFT substrate as claimed in claim 1, wherein the backing plate comprises a glass substrate; the gate electrode, the source electrode, and the drain electrode each comprise a material comprising one or multiple ones of molybdenum, aluminum, copper, titanium, and chromium; the gate insulation layer and the passivation layer each comprise a material comprising one or multiple ones of silicon oxide and silicon nitride.

5. The manufacturing method of the TFT substrate as claimed in claim 2, wherein Step 4 further comprises: forming an organic light-emitting diode (OLED) emissive layer and a second electrode in the second via in sequence from bottom to top; the first electrode and the second electrode are respectively an anode and a cathode; and the first electrode and the second electrode each comprise a material comprising one or multiple ones of a metal and a transparent conductive metal oxide.

6. A thin-film transistor (TFT) substrate, comprising: a backing plate, a gate electrode arranged on the backing plate, a gate insulation layer arranged on the gate electrode and the backing plate, an active layer arranged on the gate insulation layer and located above and corresponding to the gate electrode, a source electrode and a drain electrode arranged on the active layer and the gate insulation layer and respectively in contact with two opposite ends of the active layer, a passivation layer arranged on the source electrode, the drain electrode, the active layer, and the gate insulation layer, and a transparent polypropylene film arranged on the passivation layer,
    wherein the passivation layer is directly located on and in contact with tops of the source electrode, the drain electrode, and the active layer, and the transparent polypropylene film is directly located on a top surface of the passivation layer such that a bottom surface of the transparent polypropylene film is in direct contact with the top surface of the passivation layer and an opposite, top surface of the transparently polypropylene film forms a flat planar surface that is opposite to the active layer.

7. The TFT substrate as claimed in claim 6, wherein the top surface of the transparent polypropylene film that is the flat planar surface constitutes a planarization layer, the TFT substrate further comprising: a first via formed in the planarization layer and the passivation layer and located above and corresponding to the drain electrode, a first electrode arranged on the planarization layer, a pixel definition layer arranged on the first electrode and the planarization layer, and a second via formed in the pixel definition layer and located above and corresponding to the first electrode such that the first electrode is set in connection with the drain electrode through the first via.

8. The TFT substrate as claimed in claim 6, wherein the active layer comprises a material of indium gallium zinc oxide.

9. The TFT substrate as claimed in claim 6, wherein the backing plate comprises a glass substrate; the gate electrode, the source electrode, and the drain electrode each comprise a material comprising one or multiple ones of molybdenum, aluminum, copper, titanium, and chromium; the gate insulation layer and the passivation layer each comprise a material comprising one or multiple ones of silicon oxide and silicon nitride.

10. The TFT substrate as claimed in claim 7 further comprising: an organic light-emitting diode (OLED) emissive layer and a second electrode formed in the second via in sequence from bottom to top, the first electrode and the second electrode being respectively an anode and a cathode, the first electrode and the second electrode each comprising a material comprising one or multiple ones of a metal and a transparent conductive metal oxide.

11. A thin-film transistor (TFT) substrate, comprising: a backing plate, a gate electrode arranged on the backing plate, a gate insulation layer arranged on the gate electrode and the backing plate, an active layer arranged on the gate insulation layer and located above and corresponding to the gate electrode, a source electrode and a drain electrode arranged on the active layer and the gate insulation layer and respectively in contact with two opposite ends of the active layer, a passivation layer arranged on the source electrode, the drain electrode, the active layer, and the gate insulation layer, and a transparent polypropylene film arranged on the passivation layer, wherein the passivation layer is directly located on and in contact with tops of the source electrode, the drain electrode, and the active layer, and the transparent polypropylene film is directly located on a top surface of the passivation layer such that a bottom surface of the transparent polypropylene film is in direct contact with the top surface of the passivation layer and an opposite, top surface of the transparently polypropylene film forms a flat planar surface that is opposite to the active layer;

wherein the active layer comprises a material of indium gallium zinc oxide; and wherein the backing plate comprises a glass substrate; the gate electrode, the source electrode, and the drain electrode each comprise a material comprising one or multiple ones of molybdenum, aluminum, copper, titanium, and chromium; the gate insulation layer and the passivation layer each comprise a material comprising one or multiple ones of silicon oxide and silicon nitride.

12. The TFT substrate as claimed in claim 11, wherein the top surface of the transparent polypropylene film that is flat planar surface constitutes a planarization layer, the TFT substrate further comprising: a first via formed in the planarization layer and the passivation layer and located above and corresponding to the drain electrode, a first electrode arranged on the planarization layer, a pixel definition layer arranged on the first electrode and the planarization layer, and a second via formed in the pixel definition layer and located above and corresponding to the first electrode such that the first electrode is set in connection with the drain electrode through the first via.

13. The TFT substrate as claimed in claim 12 further comprising: an organic light-emitting diode (OLED) emissive layer and a second electrode formed in the second via in sequence from bottom to top, the first electrode and the second electrode being respectively an anode and a cathode, the first electrode and the second electrode each comprising a material comprising one or multiple ones of a metal and a transparent conductive metal oxide.

\* \* \* \* \*